United States Patent
Arayashiki

(10) Patent No.: US 9,379,163 B1
(45) Date of Patent: Jun. 28, 2016

(54) VARIABLE RESISTANCE MEMORY DEVICE

(71) Applicant: KABUSHIKI KAISHA TOSHIBA, Minato-ku (JP)

(72) Inventor: Yusuke Arayashiki, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/847,421

(22) Filed: Sep. 8, 2015

Related U.S. Application Data

(60) Provisional application No. 62/129,375, filed on Mar. 6, 2015.

(51) Int. Cl.
*H01L 29/02* (2006.01)
*H01L 27/24* (2006.01)
*H01L 45/00* (2006.01)

(52) U.S. Cl.
CPC ........ *H01L 27/2409* (2013.01); *H01L 27/2463* (2013.01); *H01L 45/08* (2013.01)

(58) Field of Classification Search
CPC ................................. H01L 45/04; H01L 45/06
USPC .................................................. 257/2, 5, 296
See application file for complete search history.

(56) References Cited

U.S. PATENT DOCUMENTS

| | | |
|---|---|---|
| 2005/0128807 A1 | 6/2005 | Chen et al. |
| 2013/0148400 A1 | 6/2013 | Murooka |
| 2013/0248796 A1 | 9/2013 | Inokuma |

FOREIGN PATENT DOCUMENTS

| | | |
|---|---|---|
| JP | 2007-513455 | 5/2007 |
| JP | 2013-120618 | 6/2013 |
| JP | 2013-201405 | 10/2013 |

*Primary Examiner* — Tan N Tran
(74) *Attorney, Agent, or Firm* — Oblon, McClelland, Maier & Neustadt, L.L.P

(57) ABSTRACT

A resistance variable memory includes a plurality of first wires, a plurality of second wires, a controller, a memory cell array, a second current rectifying element and a second variable resistance element, an access controller, a first contact plug, and a second contact plug. The access controller switches the second variable resistance element to a low resistance state or a high resistance state in accordance with a voltage applied to the memory cell connected in series. The first contact plug is connected to the even-numbered first wire in the second direction from the substrate via the corresponding access controller. The second contact plug is connected to the odd-numbered first wire in the second direction from the substrate via the corresponding access controller.

20 Claims, 11 Drawing Sheets

VARIABLE RESISTANCE MEMORY DEVICE

CROSS REFERENCE TO RELATED APPLICATIONS

This application is based upon and claims the benefit of priority from the prior U.S. Provisional Patent Application No. 62/129,375 filed on Mar. 6, 2015, the entire contents of which are incorporated herein by reference.

FIELD

The present invention relates to a resistance variable memory.

BACKGROUND

Recently, a resistance variable memory which uses a variable resistance element as a storage element is focused as a next-generation nonvolatile memory alternative to flash memory. The resistance variable memory does not need a transistor to store data in a storage layer and can form a memory cell including the storage layer at a crossing area of a bit line and a word line, and therefore it is easy to be miniaturized. Therefore, it is being considered that the bit line and the word line are three-dimensionally laminated to improve an integration degree.

In the case where the bit line and the word line are three-dimensionally arranged, it is necessary to secure a wiring area for connecting the bit line and the word line on a semiconductor substrate. When the bit line and the word line are separately connected on a semiconductor substrate, a ratio of the wiring area with respect to a memory cell area is increased, and an integration degree cannot be increased. Therefore, a method is considered in which at least one of the bit line and the word line is connected to a semiconductor substrate via a common contact plug to decrease the wiring area.

However, for example, when laminated multiple word lines are connected to the common contact plug and when an off-leak current flows to a non-selected word line connected to a memory cell not to be written, the current also flows to the contact plug. Therefore, a voltage of a selected word line connected to a memory cell to be written might fluctuate due to the off-leak current.

DETAILED DESCRIPTION

A resistance variable memory according to an embodiment includes a plurality of first wires, a plurality of second wires, a memory cell, an access controller, a first contact plug, and a second contact plug. The plurality of first wires are arranged at intervals in a first direction on a substrate and also arranged at intervals in a second direction. The plurality of second wires are arranged at intervals in a third direction crossing in the first and second directions and alternately arranged with the first wire in the second direction. The memory cell is arranged at each crossing point with the first wire and the third wire and includes a first variable resistance element. The access controller includes a second variable resistance element connected in series to the memory cell via the first wire and changes a resistance of the second variable resistance element in accordance with a voltage applied to the memory cell connected in series. The first contact plug and the second contact plug alternatively drive the plurality of first wires aligned in the second direction via the corresponding access controller.

Figure 1:
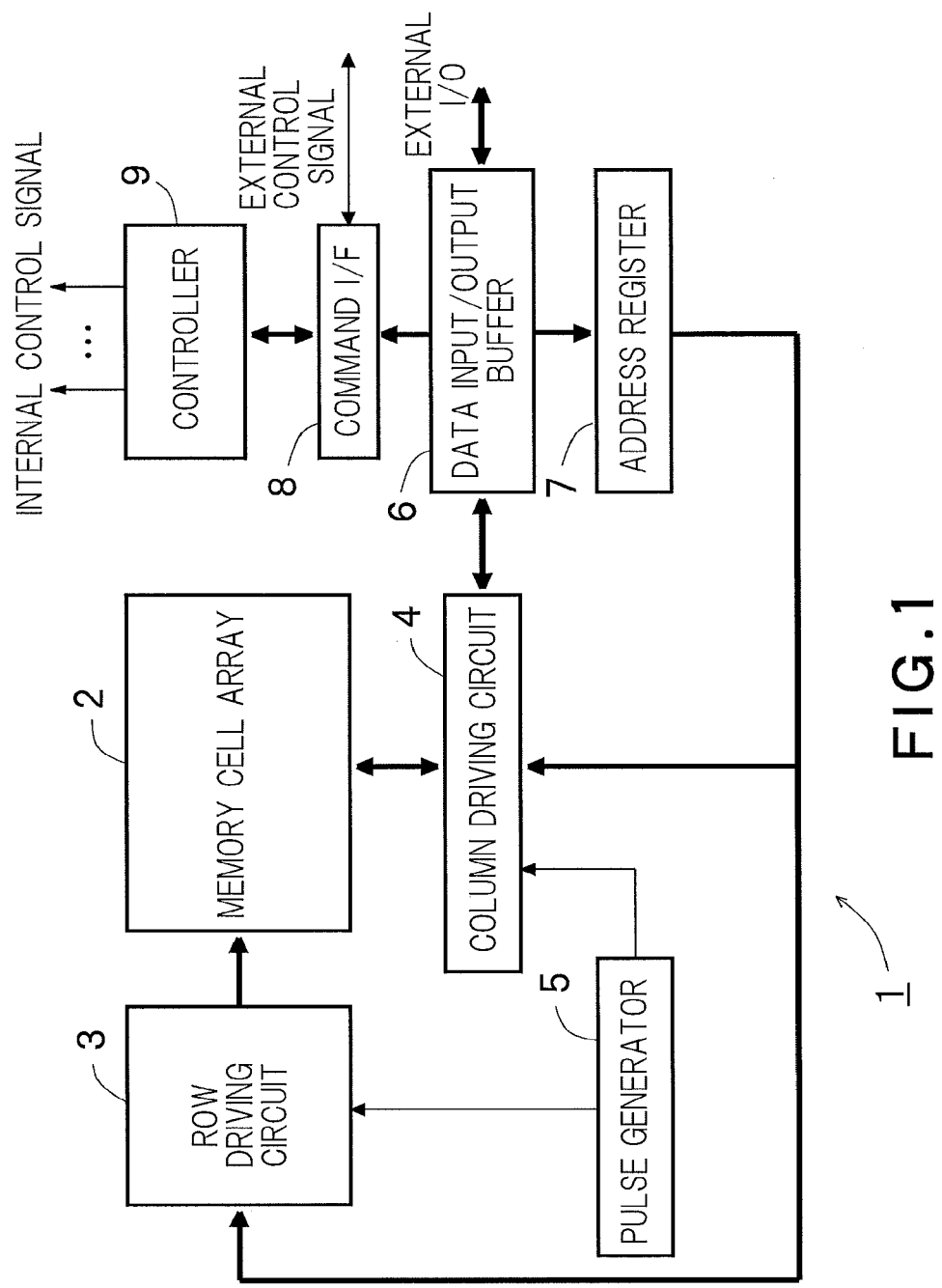
FIG. 1 is a block diagram illustrating an internal configuration of a resistance variable memory according to an embodiment.

FIG. 1 is a block diagram illustrating an internal configuration of a resistance variable memory 1 according to an embodiment. The resistance variable memory 1 illustrated in FIG. 1 includes a memory cell array 2, a row driving circuit 3, a column driving circuit 4, a pulse generator 5, a data input/output buffer 6, an address register 7, a command interface (command I/F) 8, and a controller 9. A configuration omitted in FIG. 1 may be included in the resistance variable memory 1. A characteristic configuration in the resistance variable memory 1 will be mainly described below.

The memory cell array 2 includes multiple memory cells which are three-dimensionally arranged. Each of the memory cells is a resistance variable memory cell including a current rectifying element and a variable resistance element. The memory cell array 2 and the memory cell will be described in detail below.

The row driving circuit 3 controls electric potential of multiple word lines arranged in the memory cell array 2. In the present description, a direction in which the multiple word lines extend is called a row direction.

The column driving circuit 4 controls electric potential of multiple bit lines arranged in the memory cell array 2. In the present description, a direction in which the multiple bit lines extend is called a column direction.

The pulse generator 5 generates a pulse signal synchronized with a timing at which the row driving circuit 3 and the column driving circuit 4 control electric potential of word lines and bit lines.

The data input/output buffer 6 is connected to a host device (not illustrated) via an external I/O line. The data input/output buffer 6 receives write data, an address and a command from the external I/O line and sends, to the external I/O line, data read from a memory cell. The data input/output buffer 6 sends, to an address register 7, the address received from the external I/O line. The address register 7 sends the received address to the row driving circuit 3 and the column driving circuit 4. Further, the data input/output buffer 6 sends, to the column driving circuit 4, the data received from the external I/O line.

A command I/F 8 receives an external control signal from the outside and determines based on the external control signal whether the data input/output buffer 6 has received any of write data, an address, and a command from the outside. The command I/F 8 sends, to the controller 9, the command received from the external I/O by the data input/output buffer 6.

The controller 9 integrally controls the resistance variable memory 1. For example, the controller 9 controls writing, reading, and erasing of a memory cell based on a command from a host device. More specifically, the controller 9 selectively drives a word line and a bit line adjacent in a laminating direction.

Each transistor included in a peripheral circuit other than the memory cell array 2 in the resistance variable memory 1 is formed on a semiconductor substrate arranged on a lower side of the three-dimensionally laminated memory cell arrays 2. The semiconductor substrate is, for example, a silicon substrate.

Figure 2:
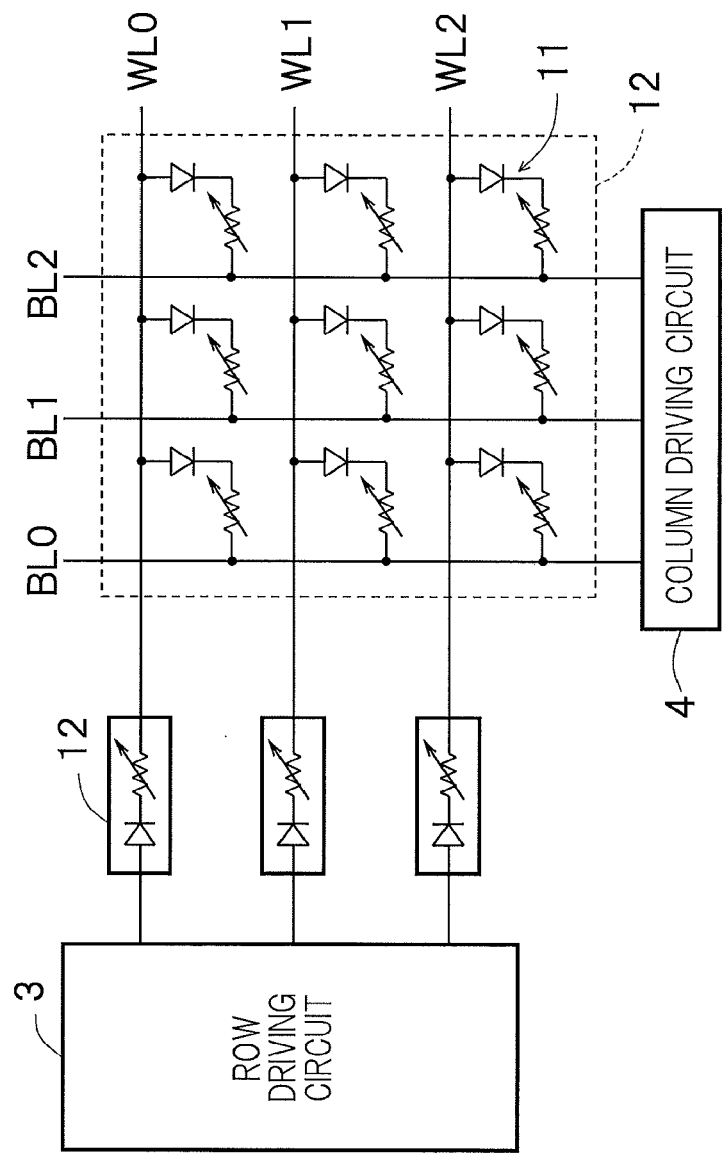
FIG. 2 is an equivalent circuit diagram of a memory cell array.

FIG. 2 is an equivalent circuit diagram of the memory cell array 2. As illustrated in FIG. 2, multiple bit lines BL0, BL1, BL2 . . . (hereinafter collectively called bit lines BL) and multiple word lines WL0, WL1, WL2 . . . (hereinafter collectively called word lines WL) are arranged in a crossing direction, and the memory cell 11 is arranged in each crossing area of multiple bit lines BL and multiple word lines WL. Specifically, the resistance variable memory 1 according to the embodiment is a cross-point type resistance variable memory. In the present description, a direction in which the multiple bit lines BL extend is called a column direction, and a direction in which the multiple word lines WL extend is called a row direction.

The memory cell 11 has a configuration in which a variable resistance element and a current rectifying element are connected in series. The variable resistance element and the current rectifying element are not necessarily formed by a separate layer. For example, in a memory cell including an upper electrode layer, an ion supply layer, a resistance change layer, and a lower electrode layer, which will be described in detail below, the ion supply layer and the resistance change layer have functions of a variable resistance element and a current rectifying element, and therefore a current rectifying element such as a diode is not necessarily separately formed.

When a potential difference between the bit line BL and the word line WL reaches a predetermined writing voltage, a variable resistance element is brought into a low resistance state. This operation is called a set operation. In addition, when a predetermined voltage in a direction opposite to a writing direction is applied to the bit line BL and the word line WL connected to the memory cell 11 including a variable resistance element in a low resistance state, the variable resistance element returns to an original high resistance state. This operation is called a reset operation. When data in the memory cell 11 is read out, a predetermined reading voltage lower than a writing voltage is applied between the word line WL and the bit line BL to determine from a current value flowing to the memory cell whether the memory cell is in a low resistance state or in a high resistance state.

As illustrated in FIG. 2, in the embodiment, a selector (access controller) 12 is connected in series to each word line WL and the memory cell 11. The selector 12 is formed by the same layer configuration as that of the memory cell 11 and has a rectifying action as with the memory cell 11. More specifically, the selector 12 switches a variable resistance element in the selector 12 to a low resistance state or a high resistance state in accordance with a voltage applied to the memory cells 11 connected to the selector 12 in series. A reason for providing such the selector 12 will be described later.

Figure 3:
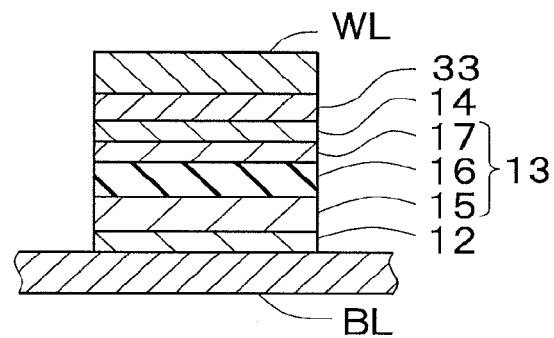
FIG. 3 is a sectional view illustrating an example of a layer configuration of a memory cell.

FIG. 3 is a sectional view illustrating an example of a layer configuration of the memory cell 11. FIG. 3 illustrates the bit line BL and the word line WL arranged on an upper side of the bit line BL. Actually, the memory cell 11 is also arranged on a lower side of the bit line BL.

In the memory cell 11 on a lower side and an upper side of the bit line BL, a lower electrode layer 12, a variable resistance element (first variable resistance element) 13, an upper electrode layer 14, and a stopper layer 33 are arranged in a lamination order toward the word line WL (34) on a lower side and an upper side from the bit line BL. The lower and upper electrode layers 12 and 14 function as a barrier metal and an adhesive layer, and for example, titanium, titanium nitride, tantalum nitride, and tungsten nitride are used as materials thereof. The materials of these electrode layers may be the same or different. Further, the electrode layers may be formed by multiple layers including different elements. In the present description, the lower electrode layer 12, the variable resistance element (first variable resistance element) 13, and the upper electrode layer 14 is called a memory cell layer.

More specifically, the variable resistance element 13 includes a counter electrode layer 15, a resistance change layer 16, and an ion supply layer 17 in a lamination order toward the word line WL on the lower side (upper side) from the bit line BL. The ion supply layer 17 is a layer including a metallic element such as silver and copper. The resistance change layer 16 include a single layer or multiple layers such as amorphous silicon, a silicone oxide film, a silicon nitride film, hafnium oxide, and zirconium oxide. The counter electrode layer 15 includes such as amorphous silicon, polysilicon, tantalum nitride, tantalum nitride silicon, and aluminum nitride. The counter electrode layer 15 may be integrated with the above-described lower electrode layer 12.

When a positive voltage is applied from the ion supply layer 17 to the counter electrode layer 15 (hereinafter, this direction is called an order direction) with respect to the memory cell 11, for example, ionized metallic elements move in the resistance change layer 16 from the ion supply layer 17. The ionized metallic elements are reduced by electrons supplied from the counter electrode 15 side, and a filament including metallic elements is formed in the resistance change layer 16. When the filament sufficiently increases in size in a film thickness direction, a resistance of the memory cell is lowered, and the memory cell is brought into a low resistance state. On the other hand, when a negative voltage is applied in the order direction, metallic elements included in a filament on the lower electrode 12 side are, for example, ionized and moved to the ion supply layer 17 side by an electric field applied in a negative direction. When the filament is removed from the resistance change layer 16, a resistance of the memory cell 11 is increased, and the memory cell is brought into a high resistance state. These two states are denoted as "0" and "1" and used in storage operating principles of the resistance variable memory 1. Although it has been described that metallic elements have ionized, the metallic elements may simply form a filament by diffusion.

Figure 5A:
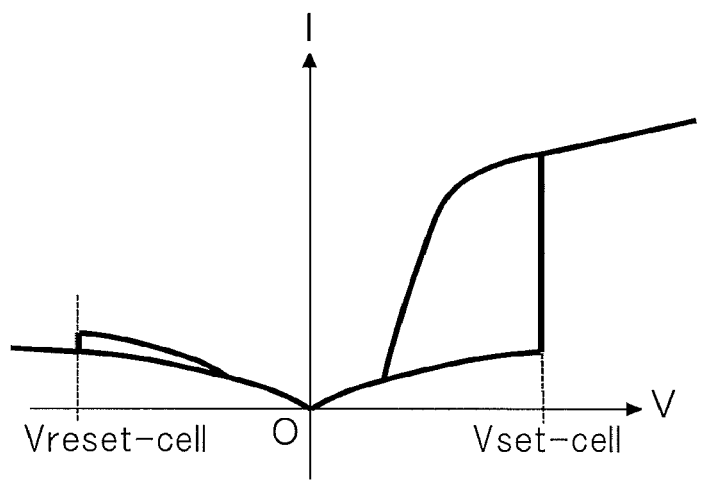
FIG. 5A is a graph illustrating I-V characteristics of the memory cell according to the embodiment.
Figure 5B:
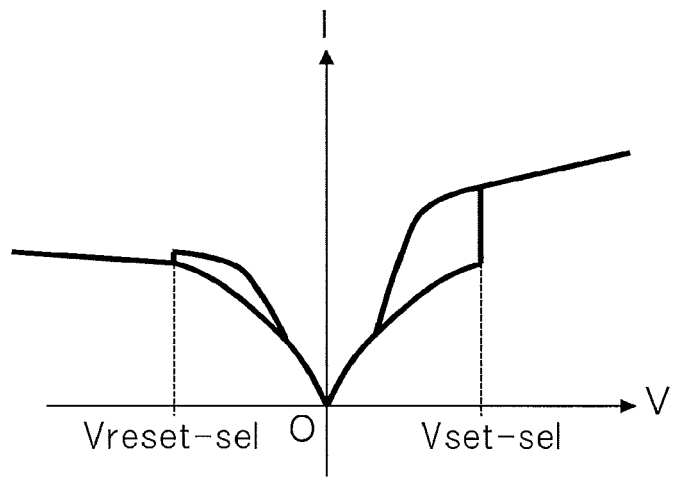
FIG. 5B is a graph illustrating I-V characteristics of a selector according to the embodiment.

Further, by selecting an appropriate combination among the ion supply layer 17, the resistance change layer 16, and the counter electrode layer 15, a function of a rectifying element can be imparted to the memory cell 11. For example, when a positive voltage in the order direction is less than a predetermined applied voltage, a metal filament formed in the resistance change layer 16 is shortened. Specifically, a gap between the filament and the counter electrode layer 15 widens. More specifically, since the gap between the filament and the counter electrode layer becomes longer, a current flowing in the memory cell 11 decreases when an applied voltage is less than a certain level, and the memory cell 11 is brought into a high resistance state. Therefore, when a voltage is applied in a negative direction after the set operation, the reset operation is performed in the resistance change layer 16 at a low current level, and therefore a current-voltage curve becomes asymmetric as illustrated in FIGS. 5A and 5B to be described later. As described above, the memory cell 11 indicates a characteristic as if the variable resistance element 13 and a current rectifying element are connected in series.

A structure of a memory cell having functions of the variable resistance element 13 and a current rectifying element has been described. However, a memory cell may have a structure in which each of the variable resistance element 13 and the current rectifying element is separately formed and arranged in series. In this case, a type of the variable resistance element 13 may not be specified if a resistance can be changed by voltage application via such as current, heat, and chemical energy. As a current rectifying element, for example, a diode formed of polysilicon is used. As a specific example of a diode, a PIN diode is used, which includes a p-type layer and an n-type layer including impurities, and an intrinsic layer inserted between the p-type layer and the n-type layer and not including impurities. In addition, each type of diodes such as a PN junction diode, which includes the p-type layer and the n-type layer, and a Schottky diode, and a punch-through diode can be used as the diode.

As illustrated in FIG. 2, in the resistance variable memory 1 according to the embodiment, each word line WL is connected to the selector 12. The selector 12 includes the same layers as those of the memory cell 11 and is equivalently expressed by a circuit in which a variable resistance element (second variable resistance element) and a current rectifying element (second current rectifying element) are connected in series. Each of the selectors 12 is connected in series to a corresponding memory cell 11 via a corresponding word line WL. Each of the selectors 12 switches a variable resistance element therein to a low resistance state or a high resistance state in accordance with a voltage applied simultaneously to the corresponding memory cell 11. Specifically, each of the selectors 12 changes a resistance of a variable resistance element in each selector 12 in accordance with a voltage applied to the memory cell 11 connected to the selector 12 in series. In an example in the embodiment, the selector 12 and the memory cell 11 have the same layer configuration. However, at least a part of the configuration may be different.

FIG. 2 indicates an example in which a word line WL is increased by a predetermined voltage in comparison with a bit line BL in the case where writing is performed to the memory cell 11. The selector 12 is brought into a low resistance state when being connected to a selected word line WL. The selector 12 is brought into a high resistance state when being connected to a non-selected word line WL.

Such the selector 12 is provided to prevent that an off-leak current flowing on a non-selected word line WL flows into a contact plug since multiple word lines WL are connected to a common contact plug in the embodiment.

In the embodiment, as described later, a hook extending from the common contact plug of the word lines WL is connected to one end of the selector 12, and the other end of the selector 12 is connected to the word line WL. Specifically, the word line WL is connected to the common contact plug via the selector 12.

For example, when data is written in a memory cell, the selector 12 connected to a selected word line is in a low resistance state, and the selector 12 connected to a non-selected word line is in a high resistance state. Therefore it is possible to selectively send a signal from the common contact plug to the selected word line WL. Further, signal flow between the non-selected word line WL and the common contact plug is blocked.

The selector 12 and the hook are formed in a process for laminating the memory cell 11, the word lines WL, and the bit lines BL. Specifically, a manufacturing process special for forming the selector 12 and the hook is not needed. More specifically, there is no possibility that the manufacturing process becomes complicated even if the selector 12 and the hook are provided.

A structure around the selector 12 according to the embodiment will be described below by using a sectional structure of the memory cell array 2.

Figure 4:
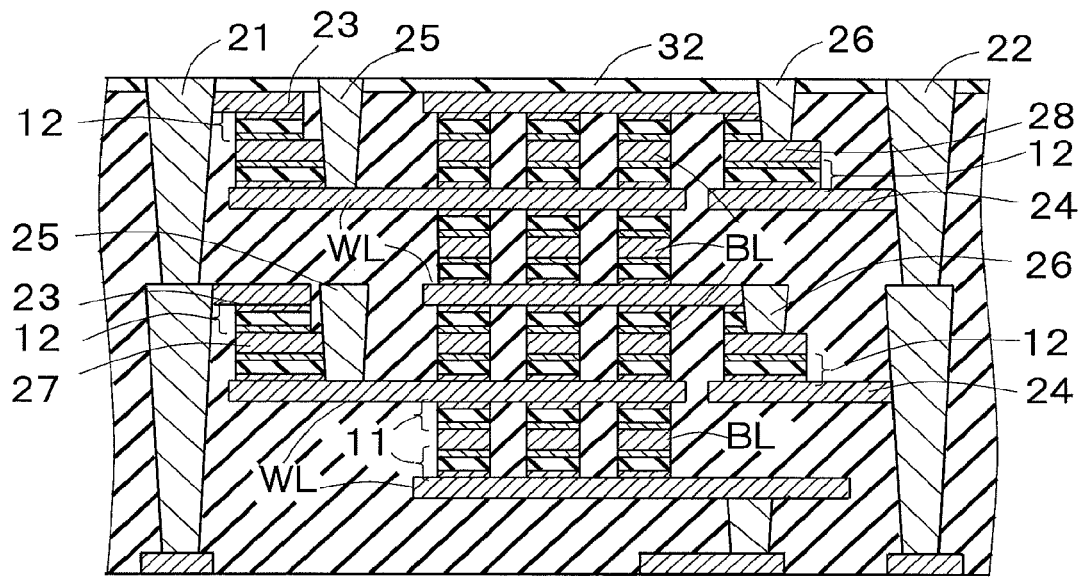
FIG. 4 is a sectional view of the memory cell array according to the embodiment.

FIG. 4 is a sectional view of the memory cell array 2 according to the embodiment. When the bit lines BL and the word lines WL are alternatively laminated, it becomes difficult to secure a wiring area for connecting the bit lines BL and the word lines WL to a semiconductor substrate, and a lamination number of the memory cell 11 cannot be increased. Therefore, a connection wire to the semiconductor substrate is commonly used with either of the bit lines BL or the word lines WL to reduce the wiring area. In an example illustrated in FIG. 4, laminated multiple word lines WL are connected to common contact plugs (a first contact plug and a second contact plug) 21 and 22. In addition, a word line on the lowest layer is connected to a wiring layer 30 of a lower layer side via a special contact plug 23. These contact plugs 21 and 22 are connected to a hookup transistor (not illustrated) formed on a semiconductor substrate or between the semiconductor substrate and a memory cell layer directly or via other contact plug and wiring layer.

Figure 7:
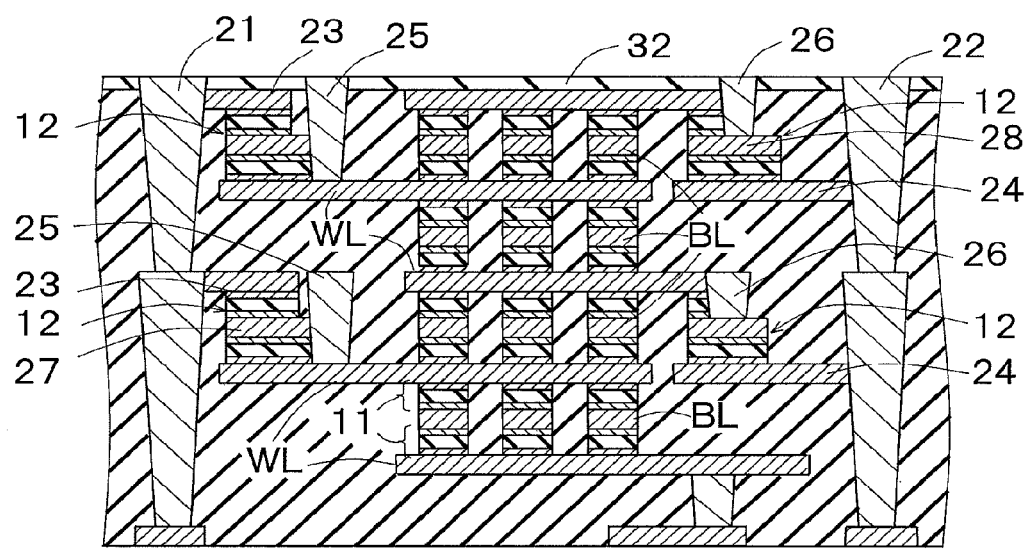
FIG. 7 is a sectional view illustrating an example of a division structure in which contact plugs are divided into plurality in a laminating direction.

In FIG. 4, two contact plugs 21 and 22 for the word lines WL are illustrated. However, three or more contact plugs 21 and 22 can be arranged in a horizontal direction (X direction) in the figure in accordance with a number of the bit lines BL. Specifically, on the basis of a bunch of laminated bodies in which multiple memory cells 11 are laminated, the contact plugs 21 and 22 are arranged on both sides across the laminated bodies. FIG. 4 illustrates an example in which eight memory cells 11 are laminated. However, a number of the memory cells 11 to be laminated is arbitrary. As illustrated in FIG. 7 to be described later, the contact plugs 21 and 22 may have a division structure, in which the contact plugs 21 and 22 are divided into plurality in a laminating direction, in accordance with a number of the memory cells 11 to be laminated.

In FIG. 4, a horizontal (substrate surface) direction is denoted by X, a laminating direction is denoted by Y, and a front and back direction on a paper is denoted by Z. Further, multiple contact plugs 21 and 22 are arranged at predetermined intervals in the illustrated Z direction. Furthermore, the contact plugs 21 and 22 extending in the Y direction may be connected to multiple contact plugs 25 and 26 branched from the contact plugs 21 and 22 as illustrated in FIG. 4.

The contact plugs 21 and 22 alternatively drive multiple word lines WL arranged in the Z direction via the corresponding selectors 12.

In the memory cell array 2 illustrated in FIG. 4, multiple word lines (first wire lines) WL are arranged at intervals in a two dimensional direction (an XZ direction and the first direction), and multiple bit lines (second wire lines) BL are arranged in a direction (the third direction or the second direction) crossing with the word lines WL at intervals in the two dimensional direction. In addition, the word lines WL and the bit lines BL are alternatively laminated in a laminating direction (the second direction and the Y direction), and the memory cell 11 are arranged in an area crossing the word lines WL and the bit lines BL. One end of the selector 12 illustrated in FIG. 2 is connected to each memory cell 11.

The hooks (the third wire and the fourth wire) 23 and 24 are connected to the contact plugs 21 and 22 in accordance with portions forming the selectors 12. The other end of the selector 12 is connected to the hooks 23 and 24. The hooks 23 and 24 are arranged at the same layer height as that of the word line WL, and film thicknesses of the hooks 23 and 24 are the same as that of the word line WL. Accordingly, the hooks 23 and 24 are formed in a process for forming the word lines WL, and a separate process for forming the hooks 23 and 24 is not needed. A layer height indicates a height from a reference surface (for example, a substrate surface).

More specifically, separate contact plugs 25 and 26 (the third and fourth contact plugs) and plug connection units (the fifth and sixth wires) 27 and 28 connected to the contact plugs 25 and 26 are provided between one end of the selector 12 and the word line WL. The contact plugs 25 and 26 are connected to the word lines WL and also connected to one end of the selectors 12 via the plug connection units 27 and 28. The plug connection units 27 and 28 are arranged at the same layer height as that of the bit line BL, and the film thicknesses of the plug connection units 27 and 28 are the same as that of the bit line BL. Accordingly, the plug connection units 27 and 28 are formed in a process for forming the bit lines BL, and a separate process for forming the plug connection units 27 and 28 is not needed.

The selector 12 has the same layer configuration as that of the memory cell 11 and arranged at the same layer height as that of the memory cell 11. Further, thicknesses of the selector 12 and the memory cell 11 in a laminating direction are the same. Configuration materials of the selector 12 and the memory cell 11 are also the same. Accordingly, the selector 12 can be formed in a process for forming the memory cell 11, and a separate process for forming the selector 12 is not needed.

The selectors 12 connected to even-numbered word lines WL in a laminating direction from a substrate is brought into a low resistance state when data is written in the memory cells 11 connected to the word lines WL. In the case where the memory cell 11 is in a non-selected state, it is prevented that an off-leak current from the memory cell 11 flows to a contact plug side by a current rectifying element in the selector 12. One end of the selector 12 is connected to an even-numbered word line WL via the plug connection unit 27 and the contact plug 25, and the other end is connected to the hook 23 (the third wire). The hook 23 is provided at the same layer height as that of an odd-numbered word line WL adjacent to the corresponding even-numbered word line WL in a laminating direction and is connected to the contact plug 21. Further, the plug connection unit 27 is provided at the same layer height as that of the bit line BL in the memory cell 11.

Similarly, the selectors 12 connected to odd-numbered word lines WL in a laminating direction from a substrate is brought into a low resistance state when data is written in the memory cell 11 connected to the word lines WL. One end of the selector 12 is connected to an odd-numbered word line WL via the plug connection unit 28 and the contact plug 26, and the other end of the selector 12 is connected to the hook 24 (the fourth wire). The hook 24 is provided at the same layer height as that of an even-numbered word line WL adjacent to the corresponding odd-numbered word line WL in a laminating direction and is connected to the contact plug 22. Further, the plug connection unit 28 is also provided at the same layer height as that of the bit line BL in the memory cell 11.

In this manner, in the case where a word line WL connected to one end side of the selector 12 is a selected word line WL, current from the contact plugs 21 and 22 is flown to the word line WL by the selector 12. In addition, in the case where a word line WL connected on one end side of the selector 12 is a non-selected word line WL, the selector 12 blocks a current path between the contact plugs 21 and 22 and the word line WL. Accordingly, an off-leak current from the memory cell 11 connected to the non-selected word line WL does not flow on the contact plug 21 and 22 sides. Therefore, there is no possibility that an electrical potential of the selected word line WL fluctuates due to the off-leak current, and writing characteristics can be improved.

With reference to FIG. 4, a connection path from the contact plugs 21 and 22 to word lines WL will be described as below. The hook 24 arranged at the same layer height as that of an even-numbered word line WL is connected to the contact plug 22 illustrated on the right side in FIG. 4. The other end of the corresponding selector 12 is connected to the hook 24, and the other end of the selector 12 is connected to an odd-numbered word line WL via the contact plug 22. The selector 12 is provided at the same layer height as that of the memory cell 11 connected to an even-numbered word line WL arranged at the same layer height as that of the hook 24.

Similarly, the hook 23 arranged at the same layer height as that of an odd-numbered word line WL is connected to the contact plug 21 on the left side. The other end of the corresponding selector 12 is connected to the hook 23, and the other end of the selector 12 is connected to an even-numbered word line WL via the contact plug 21. The selector 12 is provided at the same layer height as that of the memory cell 11 connected to an odd-numbered word line WL arranged at the same layer height as that of the hook 23.

In this manner, the selector 12 is arranged at the same layer height and formed by the same configuration and the same film thickness as those of the memory cell 11. Similarly, the hooks 23 and 24 are arranged at the same layer height, formed of the same material, and have the same film thickness as those of the word line WL. Therefore, the selector 12 is formed in the same manufacturing process as that for the memory cell 11 arranged at the same layer height, and the hooks 23 and 24 can be formed in the same manufacturing process as that for the word line WL arranged at the same layer height.

FIG. 5A is a graph illustrating I-V characteristics of the memory cell 11 according to the embodiment. FIG. 5B is a graph illustrating I-V characteristics of the selector 12 according to the embodiment. With reference to the graphs, electrical characteristics of the memory cell 11 and the selector 12 will be described below.

In the case where data is written in the memory cell 11, specifically in a set operation of the memory cell 11, a set voltage Vset-sel needed to bring the selector 12 into a low resistance state (set state) is preferably lower than a set voltage Vset-cell needed to bring the memory cell 11 to be written into a low resistance state. In the case of Vset-sel<Vset-cell, when data is written in the memory cell 11, the selector 12 is brought into a low resistance state before the memory cell 11 to be written is set. Therefore, a desired set voltage is applied to a word line WL connected to the memory cell 11. As a result, the memory cell 11 can be set without delay and without changing a writing voltage level so much in comparison with the case where the selector 12 is not provided.

For example, when data is written (while setting), a set voltage Vset-cell of a selected word line WL is set to 5 V, a bit line BL voltage is set to 0 V, and a voltage of a non selected word line WL Vunset-cell is set to 2.5 V. This is an example, and preferably a proper voltage is supplied to a word line WL and a bit line BL in accordance with characteristics of the memory cell 11.

When data is read from the memory cell 11, a reading voltage Vread applied to the memory cell 11 is preferably larger than a set voltage Vset-sel for bringing the selector 12 into a low resistance state. In the case of Vread>Vset-sel, the selector 12 is brought into a low resistance state before a voltage applied to the contact plugs 21 and 22 reaches to the Vread. Therefore, the Vread can be applied to the memory cell 11 without lowering a voltage in the selector 12, and the data can be normally read.

When the memory cell 11 is erased, specifically in a reset operation of the memory cell 11, a reset current Ireset-cell flowing when a reverse bias voltage is applied to the memory cell 11 to be written is preferably smaller than a reset current Ireset-sel flowing when a reverse bias voltage is applied to the selector 12. In the case of Ireset-cell<Ireset-sel, a resistance of the memory cell 11 in the reset operation becomes higher than a resistance of the selector 12. Therefore, during the reset operation, a voltage is easily applied to the memory cell 11 having a higher resistance than the selector 12, and the memory cell 11 can be erased without much delay in comparison with the case where the selector 12 is not provided.

For example, when the memory cell is erased (while resetting), a voltage of a word line WL is set to 0 V, and a voltage of a bit line BL is set to 5 V.

As seen by comparing graphs in FIGS. 5A and 5B, the selector 12 has characteristics that it is set at a voltage smaller than that of the memory cell 11 and is easily reset, and a reset current is high. To have such the characteristics, an area of the selector 12 needs to be larger than an area of the memory cell 11. In the case where the area of the memory cell 11 is large, a probability of generating a core portion for forming a filament in a set operation is increased. As a result, a voltage necessary for the filament formation is lowered, and a set voltage is lowered. It is the same in a reset operation, the more the area increases, the more a voltage necessary for the reset operation decreases. Further, an off-leak current of a memory cell increases since the area increases, and therefore, a relation of Ireset-cell<Ireset-sel in the above-described reset operation can be easily established. Furthermore, in the case where electric characteristics of the selector 12 and the memory cell 11 are similar, conditions of the above-described set operation, reading operation, and reset operation might be reversed due to a manufacturing variation. For example, in the case where an area of the selector 12 is more than one hundred times of an area of the memory cell 11, there is no possibility that electric characteristics of the selector 12 and the memory cell 11 are reversed even if a manufacturing variation occurs.

As seen from the above description, the selector 12 connected to a selected word line WL is preferably in a set state in advance. Further, to prevent an off-leak from a non-selected word line WL, the selector 12 connected to the non-selected word line WL is preferably in a reset state. To realize such the operations, one of a plurality of upper and lower memory cells 11 connected to the word lines WL may be used for switching the selector 12. Hereinafter, such the memory cell 11 is called a memory cell for switching. For example, in the case where the memory cell 11 formed between the bit line BL0 closest to the selector 12 and a word line WL is set to the memory cell for switching, a predetermined voltage is applied between the word line WL and the bit line BL0 in a set operation. Then, both of the memory cell for switching and the selector 12 are brought into a set state, and a resistance is lowered. Next, a desired bit line BL is selected, a voltage is applied to the memory cell 11 formed between the word line WL and the bit line. In this operation method, a voltage necessary for immediately setting the memory cell 11 to be accessed can be applied since the selector 12 has been already set before access to an arbitrary memory cell 11. Further, in the case where the word line WL is not selected, a voltage in a reverse direction is applied between the bit line BL0 and the word line WL not to be selected to bring the selector 12 into a high resistance state. In the case of performing the above operation, a set voltage of the memory cell for switching is preferably as low as or lower than that of the selector 12, and a reset current thereof is preferably higher than that of the selector 12. Therefore, an area of the selector 12 is preferably smaller than an area of the memory cell for switching.

In this manner, among memory cells connected to word lines, the memory cell for switching (second memory cell) to be used for bringing the selectors connected to word lines into a set state or a reset state is preferably provided other than a memory cell to be used for writing and reading data (first memory cell). In the case of selecting a word line, the memory cell for switching is brought into a set state by applying a set voltage to the selector 12 connected to the word line before starting access to the first memory cell on the word line, and in the case where the word line is brought into a non-selected state, a reset voltage is applied to the selector 12 connected to the word line.

In the embodiment, the selector 12 is assumed to be formed at the same layer height and with the same configuration as those of the memory cell 11. However, areas of the memory cell 11 and the selector 12 can be relatively easily changed. Therefore, while the memory cell 11 and the selector 12 are formed in the same manufacturing process, electrical characteristics of the memory cell 11 and the selector 12 have a major difference, and the selector 12 can be used as a rectification circuit when the memory cell is accessed.

Figure 6A:
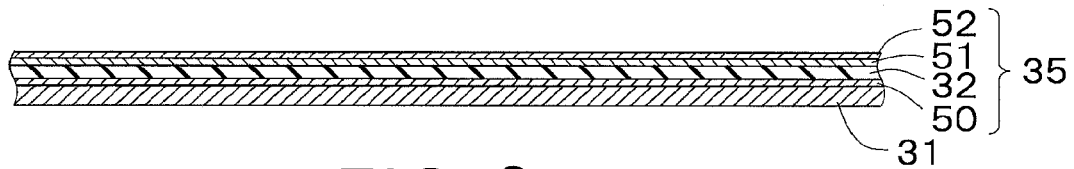
FIGS. 6A to 6T are sectional views illustrating a method for manufacturing the memory cell array in the resistance variable memory according to the embodiment.
Figure 6B:
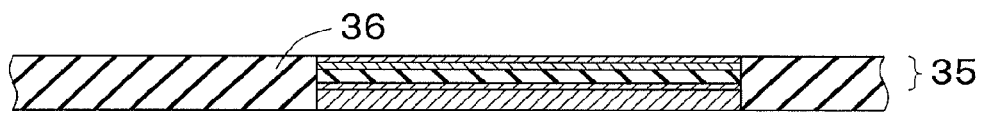
Figure 6C:
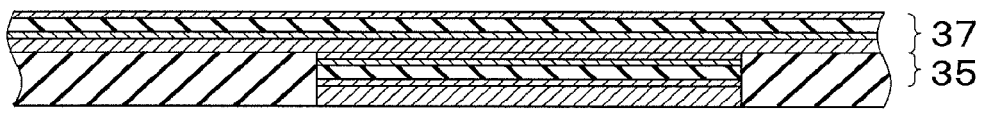
Figure 6D:
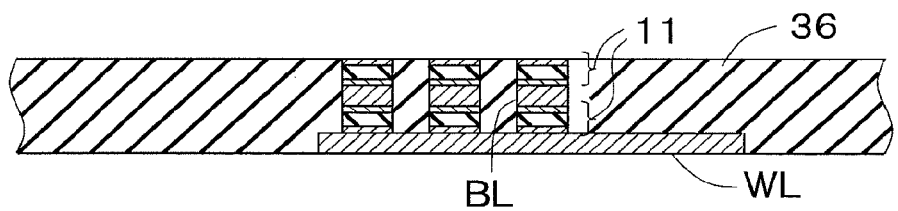
Figure 6E:
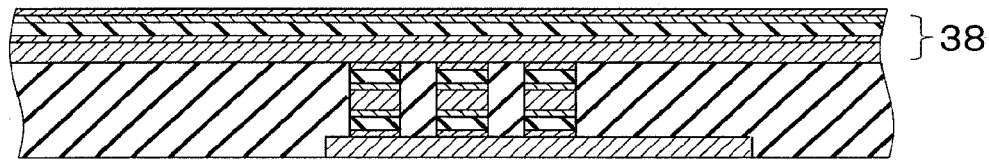
Figure 6F:
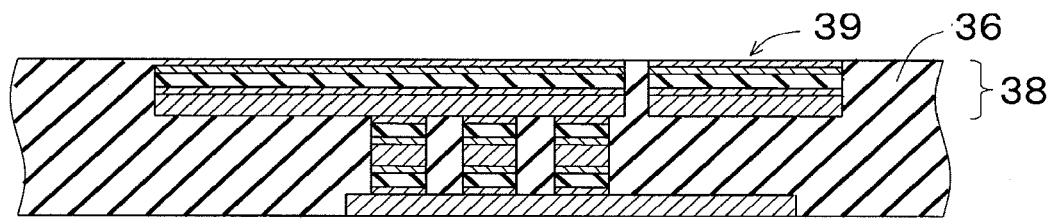
Figure 6G:
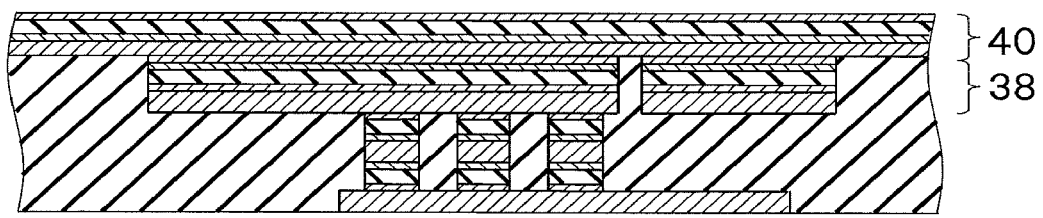
Figure 6H:
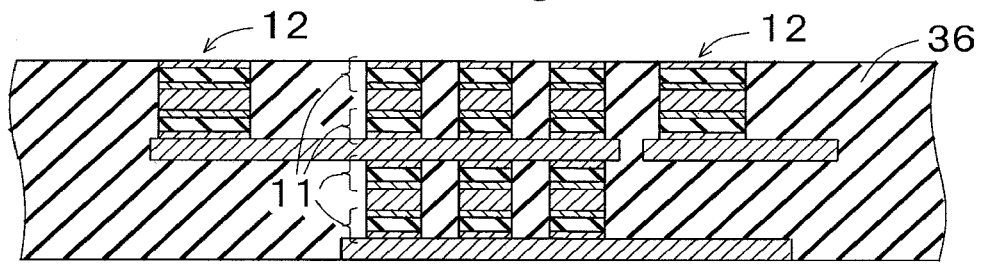
Figure 6I:
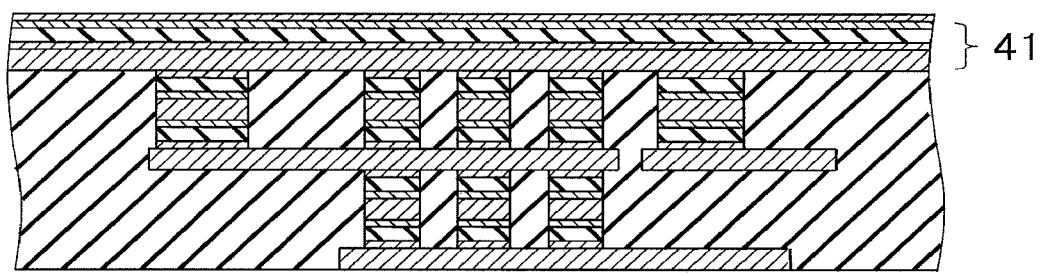
Figure 6J:
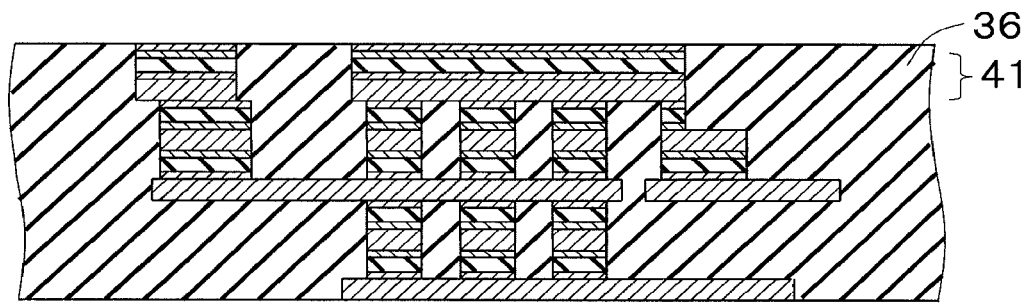
Figure 6K:
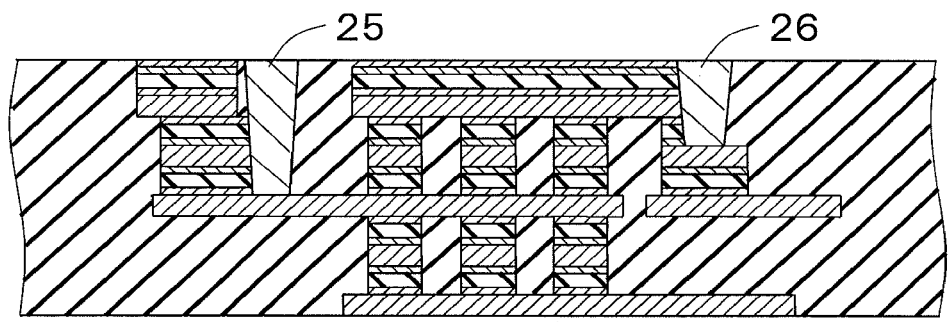
Figure 6L:
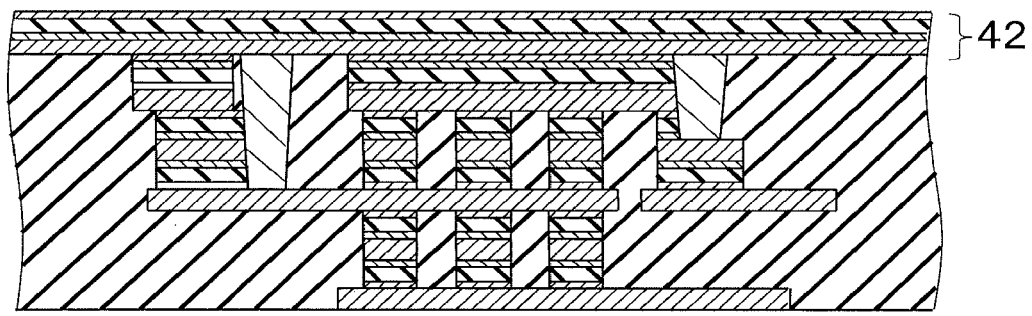
Figure 6M:
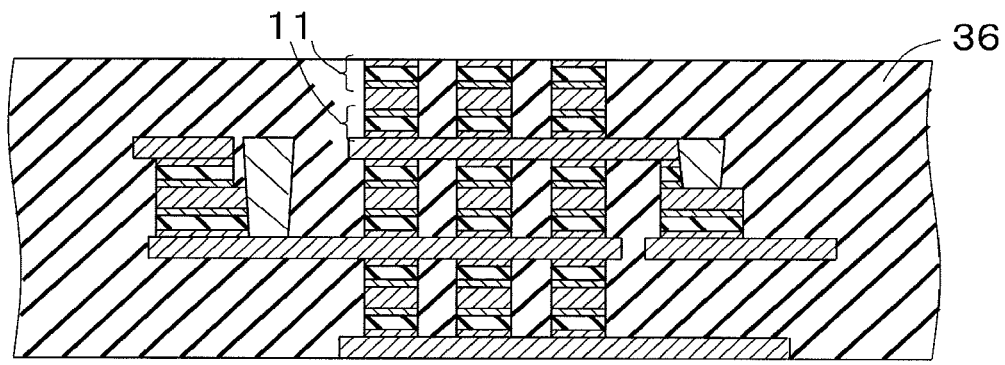
Figure 6N:
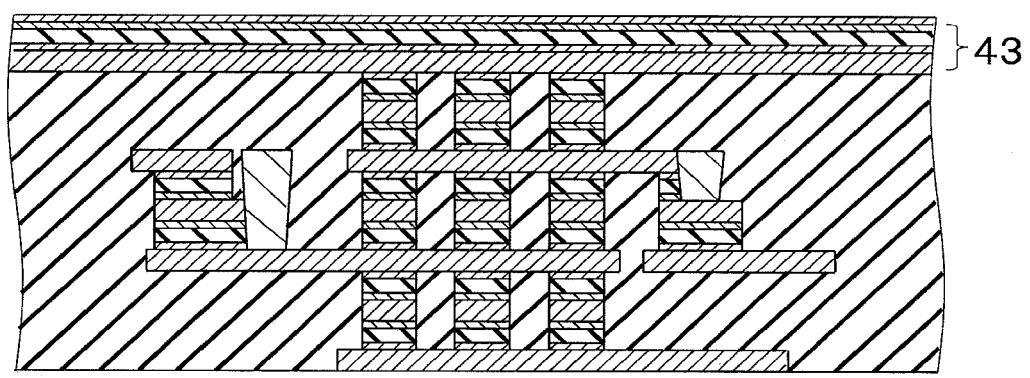
Figure 6O:
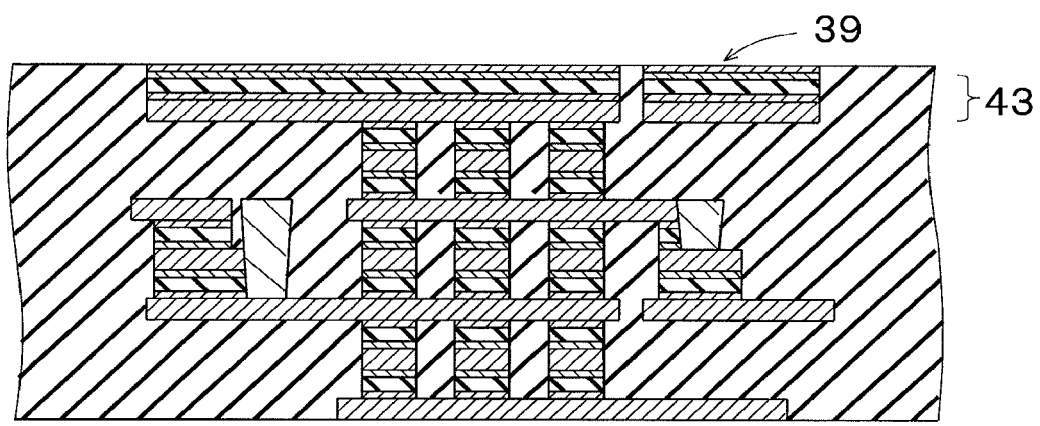
Figure 6P:
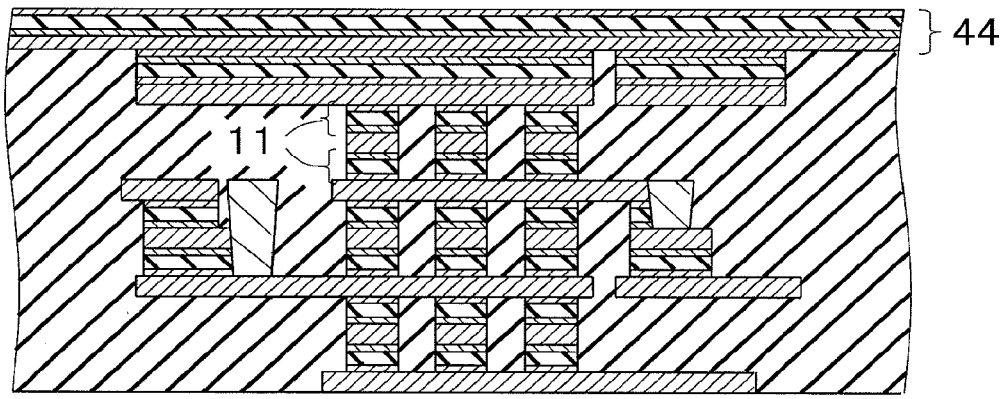
Figure 6Q:
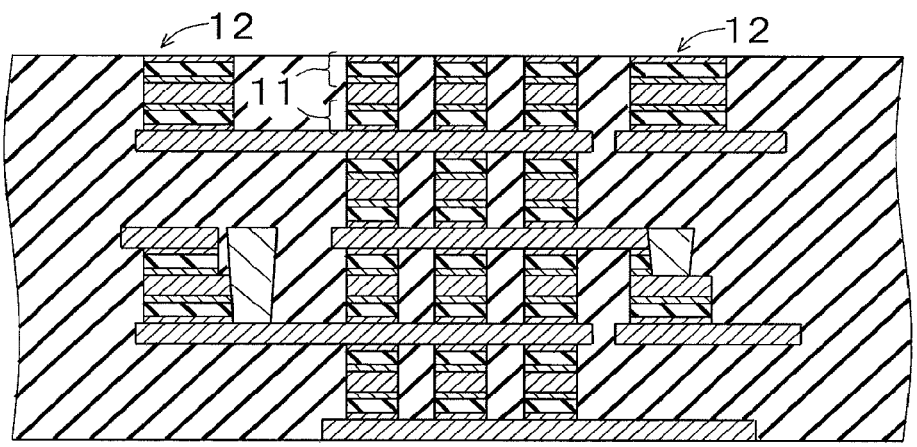
Figure 6R:
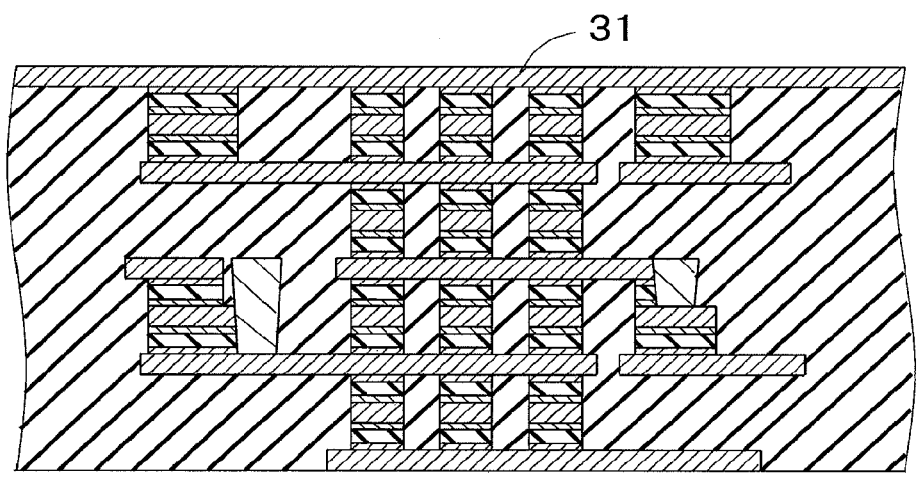
Figure 6S:
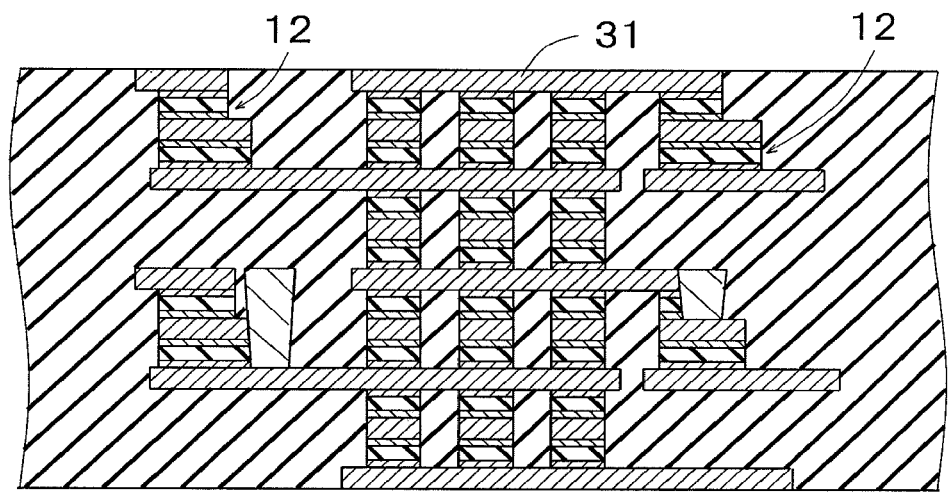
Figure 6T:
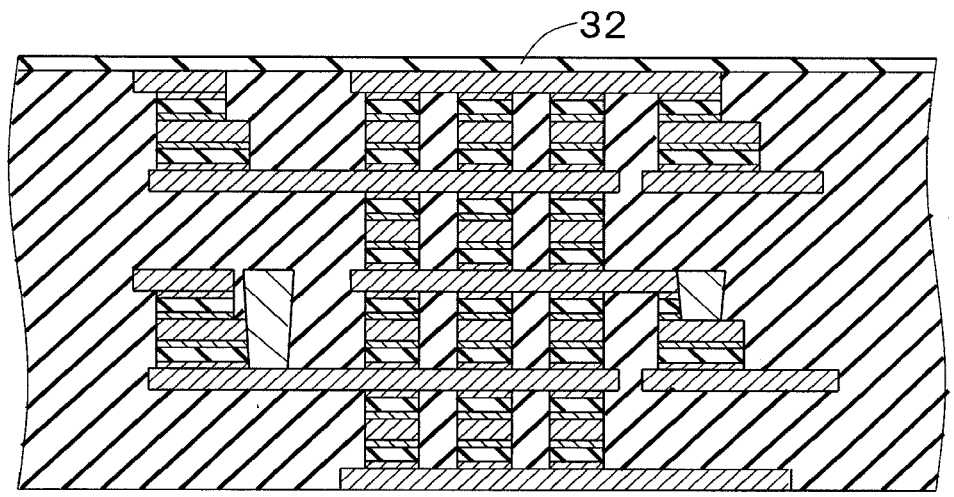

FIGS. 6A to 6T are sectional views illustrating a method for manufacturing the memory cell array 2 of the resistance variable memory 1 according to the embodiment. The method for manufacturing the memory cell array 2 in the resistance variable memory 1 according to the embodiment will be described below with reference to the figures.

After forming a peripheral circuit of the resistance variable memory 1 such as a hookup transistor for connecting the contact plugs 21 and 22 on a semiconductor substrate, an interlayer insulating film covers thereon. Next, a contact 23 for connecting to the first-layer word line WL and an interlayer insulating film around the contact 23 are formed to the wiring layer 30 connected to a peripheral circuit. A manufacturing process on a lower side than the first-layer word line WL is omitted in FIG. 6.

As illustrated in FIG. 6A, on the interlayer insulating film, a first lamination film 35 is formed on a conductor film 31 which becomes the first-layer word line WL. In the first lamination film 35, a lamination film 50, a material film 32, a conductive layer 51, and a conductive layer 52 are laminated in an order from the conductor film 31 side. The lamination film 50 becomes a material of the stopper layer 33 and the upper electrode layer 14. The material film 32 becomes the ion supply layer 17 and the resistance change layer 16. The conductive layer 51 is a material of the counter electrode layer 15. The conductive layer 52 is a material of the lower electrode layer 12. Conductor films for a word line WL and a bit line BL are, for example, W, WSi, NiSi, and CoSi.

Next, patterning of the first-layer word line WL is performed by a lithography technique, and the first lamination film 35 is processed by reactive ion etching. Subsequently, the interlayer insulating film 36 is embedded in a portion in which the first lamination film 35 has been removed, and then planarization is performed. Consequently, the sectional configuration illustrated in FIG. 6B is formed. The interlayer insulating film 36 is formed by an insulator such as a silicone oxide film and a silicon nitride film, and formed by a single layer or multiple layers.

Next, as illustrated in FIG. 6C, on the patterned first lamination film 35, in the reverse order of the lamination order of the first lamination film 35, a conductor film 34, the conductor film 33, and the material film 32 are laminated in this order to form a second lamination film 37. The conductor film 34 becomes a bit line BL. The conductor film 33 becomes a stopper. The material film 32 becomes the variable resistance element 13. As a result, for example, a variable resistance element is formed on a current rectifying element.

Next, patterning of the first-layer bit line BL is performed by a lithography technique, and with processing by reactive ion etching, layers to the variable resistance element 13 of the first lamination film 35 and the second lamination film 37 are collectively patterned. After the interlayer insulating film 36 is embedded, planarization is performed, and consequently a configuration illustrated in FIG. 6D is formed.

Next, as illustrated in FIG. 6E, on the second-layer memory cell 11 and the interlayer insulating film 36, a third lamination film 38 is formed in the same lamination order as that of the first lamination film 35. Subsequently, as illustrated in FIG. 6F, patterning of the second-layer word line WL is performed by a lithography technique, and layers to memory cell layers of the third lamination film 38 and the second lamination film 37 are processed. After an interlayer insulating film is embedded, planarization is performed. At this time, an area 39 is formed which will be the selector 12 of the second-layer and third-layer word lines WL.

Next, as illustrated in FIG. 6G, on the patterned third lamination film 38, the fourth lamination film 40 is formed in the same lamination order as that of the second lamination film 37. Then, as illustrated in FIG. 6H, patterning of the second-layer bit line BL is performed by a lithography technique, layers to memory cell layers of the fourth lamination film 40 and the third lamination film 38 are processed. After an interlayer insulating film is embedded, planarization is performed. At this time, a portion which will be the selector 12 of the second-layer and third-layer word lines WL is formed.

Next, as illustrated in FIG. 6I, on the fourth-layer memory cell 11 and the interlayer insulating film 36, a fifth lamination film 41 is formed in the same lamination order as those of the first and third lamination films 35 and 38. Subsequently, as illustrated in FIG. 6), patterning of the third layer word line WL is performed by a lithography technique, and layers to memory cell layers of the fifth lamination film 41 and the fourth lamination film 40 are processed. After an interlayer insulating film is embedded, planarization is performed.

Next, as illustrated in FIG. 6K, a contact hole is patterned by a lithography technique and processed by reactive ion etching. A conductor such as Ti and W is filled in the formed contact hole, and the contacts 25 and 26 are formed by planarization. At this time, the contacts 25 and 26 are formed so as to connect the selector 12 formed by processing between the second-layer word line WL and the third-layer bit line BL while simultaneously connecting the selector 12 formed by processing the third-layer word line WL and the second-layer bit line BL.

Next, as illustrated in FIG. 6L, on the patterned fifth lamination film 41, a sixth lamination film 42 is formed in the same lamination order as that of the second lamination film 37. Then, as illustrated in FIG. 6M, patterning of the third-layer bit line BL is performed by a lithography technique, and layers to memory cell layers of the sixth lamination film 42 and the fifth lamination film 41 are processed. After an interlayer insulating film is embedded, planarization is performed.

Next, as illustrated in FIG. 6N, on the sixth-layer memory cell 11 and the interlayer insulating film 36, a seventh lamination film 43 is formed in the same lamination order as that of the first lamination film 35. Subsequently, as illustrated in FIG. 6O, patterning of the fourth-layer word line WL is performed by a lithography technique, and layers to memory cell layers of the seventh lamination film 43 and the sixth lamination film 42 are processed. After an interlayer insulating is embedded, planarization is performed. At this time, the area 39 which will be the selector 12 of the fourth-layer and fifth-layer word lines WL is formed.

Next, as illustrated in FIG. 6P, on the patterned seventh lamination film 43, an eighth lamination film 44 is formed in the same lamination order as that of the second lamination film 37. Then, as illustrated in FIG. 6Q, patterning of the fourth-layer bit line BL is performed by a lithography technique, and layers to memory cell layers of the eighth lamination film 44 and the seventh lamination film 43 are processed. After an interlayer insulating film is embedded, planarization is performed. At this time, a portion which will be the selector 12 of the fourth-layer and fifth-layer word lines WL is formed.

Next, as illustrated in FIG. 6R, on the fourth-layer memory cell 11 and the interlayer insulating film 36, the conductor film 31 which will be a word line is formed. Subsequently, as illustrated in FIG. 6S, patterning of the fifth layer-word line WL is performed by a lithography technique, and layers to memory cell layers of the conductor film 31 and the eighth lamination film 44 are processed. After the interlayer insulating film 36 is embedded, planarization is performed. At this time, a portion which will be the selector 12 of the fifth-layer word line WL is formed.

Next, as illustrated in FIG. 6T, after the interlayer insulating film 32 is formed on the patterned fifth word line and the interlayer insulating film 36, a contact hole is patterned by a lithography technique, the interlayer insulating film 36 is processed by reactive ion etching, a conductor such as Ti and W is filled in the formed contact hole, and planarization is performed. Accordingly, the contacts 25 and 26 illustrated in FIG. 4 are formed. At this time, the contact 25 connects the selector 12 formed by processing the fourth-layer word line WL and the fourth-layer bit line BL. The contact 26 connects the selector 12 formed by processing the fifth-layer word line WL and the fourth-layer bit line BL.

Subsequently, the contacts 21 and 22 which connect a lower wiring layer and a word line WL on each layer are formed. The bit line BL is also connected to the lower wiring layer via a contact (not illustrated). The word line WL and the bit line BL are connected to a transistor of a peripheral circuit via the contacts.

As illustrated in FIG. 4, in the above-described memory cell 11, all word lines on odd-numbered layers except for the first layer are connected to the contact 21, and all word lines on even-numbered layers are connected to the contact 22. However, when a lamination number of the memory cell 11 is increased, it becomes difficult in a manufacturing process that the contacts 21 and 22 are formed by forming one contact hole penetrating through the memory cell area. Therefore, as illustrated in FIG. 7, the contact 21 and 22 have a division structure including multiple contact portions, and individual contact portion may be sequentially formed in an interim period during processes for forming the memory cell 11 and the selector 12.

In this manner, in the embodiment, the selector 12 is provided between the contact plugs 21 and 22 and each word line WL so that an off-leak current does not flow into common contact plugs 21 and 22 connected to laminated word lines WL. The selector 12 has the same structure as that of the memory cell 11 of the resistance variable memory 1. The selector 12 connected to a selected word line WL in a set operation is brought into a low resistance state, and the selector connected to a non-selected word line is kept in a high resistance state. Therefore, an off-leak current from a memory cell connected to a non-selected word line WL is blocked by arranging the selector 12 having a high resistance in series, and there is no possibility that writing characteristics of the resistance variable memory 1 is lowered.

Further, the selector 12 according to the embodiment is formed by the same layer configuration as that of the memory cell and formed at the same layer height as that of the corresponding memory cell 11. Therefore, the selector 12 can be formed in the process for forming the memory cell 11, and the selector 12 can be relatively easily formed.

Further, when a formation area of the selector 12 is larger than a formation area of the memory cell 11, an operation voltage of the selector 12 can be lowered, and an operation voltage necessary for writing and reading of the memory cell 11 is lowered. In addition, since a resistance of the selector 12 is lowered when the area is large, a voltage can be effectively applied to the memory cell 11 during erasing. From the above reasons, when the area of the selector 12 becomes larger than the area of the memory cell 11, there is no possibility that writing/reading/erasing characteristics of the memory cell 11 are adversely affected.

In the above-described embodiment, laminated multiple word lines WL are connected to the common contact plugs 21 and 22, and the selector 12 is connected to each word line WL. However, the laminated multiple bit lines BL may be connected to the common contact plugs 21 and 22, and each bit line BL may be connected to the selector 12. In this case, the selector 12 connected to a selected bit line BL needs to be in a low resistance state, and the selector 12 connected to a non-selected bit line BL needs to be in a high resistance state.

The configuration of the memory cell array 2 according to the above-described embodiment will be summarized as below.

A resistance variable memory includes first wires WL, second wires BL, third wires WL, the controller 9, the first memory cell 11, the second memory cell 11, the first contact plug 25, the second contact plug 26, a fourth wire 27, a fifth wire 27, a sixth wire 23, a seventh wire 24, a third current rectifying element and a third variable resistance element, and a fourth current rectifying element and a fourth variable resistance element. The multiple first wires WL are arranged at intervals in a first direction on a substrate. The multiple second wires BL are arranged at intervals in a second direction on the first wires. The multiple third wires WL are arranged at intervals in the first direction on the second wire. The controller 9 selectively drives the first wire, the second wire, and the third wire, which are adjacent in a laminating direction. The first memory cell 11 includes a first current rectifying element and a first variable resistance element, which are arranged at a crossing point with the first wire and the second wire. The second memory cell 11 includes a second current rectifying element and a second variable resistance element, which are arranged at a crossing point with the second wire and the third wire. The first contact plug 25 is electrically connected to the first wire and at least partially arranged on an upper side of the first wire. The second contact plug 26 is electrically connected to the third wire and at least partially arranged on a lower side of the third wire. The fourth wire 27 is provided by being electrically connected to the first contact plug. The fifth wire 27 is provided by being electrically connected to the second contact plug. The sixth wire 23 is provided on an upper side of the fourth wire. The seventh wire 24 is provided on a lower side of the fifth wire. The third current rectifying element and the third variable resistance element are arranged between the fourth wire and the sixth wire and connected in series to the first memory cell via the fourth wire and the first wire. The fourth current rectifying element and the fourth variable resistance element are arranged between the fifth wire and the seventh wire and connected in series to the second memory cell via the fifth wire and the third wire.

The fourth wire and the fifth wire are arranged at almost the same height as the second wire.

The sixth wire is arranged at almost the same height as the third wire. The seventh wire is arranged at the same height as the first wire.

Further, the third contact plug 21 and the fourth contact plug 22 are provided. The third contact plug 21 is electrically connected to the sixth wire and provided separately in a direction extending from the first wire. The fourth contact plug 22 are electrically connected to the seventh wire and provided separately in a direction extending from the third wire.

The height of the first contact plug is larger than that of the second contact plug.

Upper surfaces of the first and second contact plugs are arranged at almost the same height.

The first contact plug is provided so as to contact to the fourth wire on a side surface thereof. The second contact plug is provided so as to contact to the fifth wire on a lower side thereof.

The first current rectifying element and the first variable resistance element include the same material as that of the fourth current, rectifying element and the fourth variable resistance element. The second current rectifying element and the second variable resistance element include the same material as that of the third current rectifying element and the third variable resistance element.

The first current rectifying element and the first variable resistance element have the same layer configuration as that of the fourth current rectifying element and the fourth variable resistance element. The second current rectifying element and the second variable resistance element have the same layer configuration as that of the third current rectifying element and the third variable resistance element.

The first current rectifying element is provided on a lower side of the first variable resistance element.

The second current rectifying element is provided on an upper side of the second variable resistance element.

According to the above-described embodiment, as illustrated in FIG. 4, word lines and bit lines are laminated in a Z direction on a substrate. However, a resistance variable memory according to the embodiment is also applicable in the case where word lines are divided into global word lines and local word lines, bit lines are divided into global bit lines and local bit lines, and memory cells including variable resistance elements are arranged at crossing points of local word lines and local bit lines.

Although multiple embodiments according to the present invention have been described, these embodiments are presented as examples and are not intended to limit the scope of the invention. These new embodiments can be performed in other various modes, and can be omitted, replaced and changed variously without departing from the gist of the invention. These embodiments and variations thereof are included in the gist and scope of the invention and included in the invention described in claims and a scope equivalent thereto.

The invention claimed is:

1. A resistance variable memory, comprising:
   a plurality of first wires arranged at intervals in a first direction on a substrate and arranged at intervals in a second direction;

a plurality of second wires arranged at intervals in a third direction crossing in the first and second directions and arranged in the second direction alternately with the first wires;
a memory cell which is arranged at each crossing point with the first wires and third wires, and includes a first variable resistance element;
access controllers which include a second variable resistance element connected in series to the memory cell via the first wire and change a resistance of the second variable resistance element in accordance with a voltage applied to the memory cell connected in series; and
a first contact plug and a second contact plug which alternatively drive the plurality of first wires aligned in the second direction via the corresponding access controller.

2. The resistance variable memory according to claim 1, wherein the memory cell includes a first current rectifying element connected in series to the first variable resistance element, and the access controller includes a second current rectifying element connected in series to the second variable resistance element.

3. The resistance variable memory according to claim 1, wherein the access controller is connected in series to each of two memory cells adjacent to each other in the second direction via the first wire.

4. The resistance variable memory according to claim 1, wherein the access controller is arranged at the same layer height as that of another memory cell adjacent in the second direction to the memory cell connected in series via the first wire.

5. The resistance variable memory according to claim 1, wherein a thickness of the access controller in the second direction is the same as a thickness of the memory cell in the second direction, and a material of the access controller is the same as a material of the memory cell.

6. The resistance variable memory according to claim 1, wherein the access controller has a wider area than an area of the memory cell.

7. The resistance variable memory according to claim 1, the access controller is brought into a low resistance state at a lower voltage than a writing voltage when data is written in the memory cell.

8. The resistance variable memory according to claim 1, wherein a voltage required when the access controller is brought into a low resistance state is lower than a voltage required when data is read from the memory cell.

9. The resistance variable memory according to claim 1, wherein the access controller is reset from a low resistance state to a high resistance state at a reverse voltage lower than the memory cell.

10. The resistance variable memory according to claim 1, comprising:
a third wire connected to the access controller connected to even-numbered first wires in the second direction and electrically conducted to the first contact plug; and
a fourth wire connected to the access controller connected to odd-numbered first wires in the second direction and electrically conducted to the second contact plug.

11. The resistance variable memory according to claim 10, wherein the third wire is arranged at the same height in the second direction as height of the odd-numbered first wire adjacent to the even-numbered first wire in the second direction, and the fourth wire is arranged at the same height in the second direction as height of the even-numbered first wire adjacent to the odd-numbered first wire in the second direction.

12. The resistance variable memory according to claim 11, wherein thicknesses in the second direction of the third wire and the fourth wire are the same as a thickness of the first wire in the second direction, and materials of the third wire and the fourth wire are the same as a material of the first wire.

13. The resistance variable memory according to claim 10, comprising:
a fifth wire arranged in a direction crossing the third wire; and
a sixth wire arranged in a direction crossing the fourth wire, wherein the access controller connected to the even-numbered first wire in the second direction is arranged at a crossing point of the third wire and the fifth wire, and the access controller connected to the odd-numbered first wire in the second direction is arranged at a crossing point of the fourth wire and the sixth wire.

14. The resistance variable memory according to claim 13, wherein the fifth wire and the sixth wire are arranged at the same height as height of the second wire on the substrate, thicknesses in the second direction of the fifth wire and the sixth wire are same as a thickness of the second wire in the second direction, and materials of the fifth wire and the sixth wire are the same as a material of the second wire.

15. The resistance variable memory according to claim 13, comprising:
a third contact plug which electrically conducts the even-numbered first wires in the second direction and the fifth wire; and
a fourth contact plug which electrically conducts the odd-numbered first wires in the second direction and the sixth wire.

16. The resistance variable memory according to claim 1, comprising a memory cell array including one or more cell laminated bodies in which the memory cells are arranged in the first direction or the third direction,
wherein the first contact plug and the second contact plug are arranged at both sides across the cell laminate.

17. The resistance variable memory according to claim 16, wherein the first wire arranged in the second direction is alternatively connected to the first contact plug or the second contact plug via the corresponding access controller.

18. The resistance variable memory according to claim 1, wherein the memory cell connected to the first wire comprises a first memory cell to be used for writing and reading data, and a second memory cell to be used to bring the access controller connected to the first wire into a low resistance state or a high resistance state, and
wherein when the first wire is brought into a selected state, the second memory cell is brought into a low resistance state by applying a predetermined set voltage to the access controller connected to the first wire before starting access to the first memory cell on the first wire, and when the first wire is brought into a non-selected state, the second memory cell is brought into a high resistance state by applying a predetermined reset voltage in a reverse direction to the set voltage to the access controller connected to the first wire.

19. The resistance variable memory according to claim 1, wherein at least either of the first contact plug or the second contact plug includes a plurality of contact units.

20. A resistance variable memory, comprising:
a plurality of first wires arranged at intervals in a first direction on a substrate;
a plurality of second wires arranged at intervals in a second direction on the first wires;
a plurality of third wires arranged at intervals in the first direction on the second wires;

a controller configured to selectively drive the first wires, the second wires, and the third wires;

a first memory cell which is arranged at crossing points with the first wires and the second wires, and includes a first current rectifying element and a first variable resistance element;

a second memory which is arranged at crossing points with the second wires and the third wires, and includes a second current rectifying element and a second variable resistance element;

a first contact plug electrically connected to the first wires and at least partially arranged on an upper side of the first wires;

a second contact plug electrically connected to the third wires and at least partially arranged on a lower side of the third wires;

a fourth wire provided by being electrically connected to the first contact plug;

a fifth wire provided by being electrically connected to the second contact plug;

a sixth wire provided on an upper side of the fourth wire;

a seventh wire provided on a lower side of the fifth wire;

a third current rectifying element and a third variable resistance element, which are arranged between the fourth wire and the sixth wire and connected in series to the first memory cell via the fourth wire and the first wire; and a fourth current rectifying element and a fourth variable resistance element, which are arranged between the fifth wire and the seventh wire and connected in series to the second memory cell via the fifth wire and the third wire.

* * * * *